United States Patent
Lee (10) Patent No.: US 7,466,622 B2
(45) Date of Patent: Dec. 16, 2008

(54) METHOD FOR CONTROLLING TIME POINT FOR DATA OUTPUT IN SYNCHRONOUS MEMORY DEVICE

(75) Inventor: Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/774,657

(22) Filed: Jul. 9, 2007

(65) Prior Publication Data

US 2008/0016261 A1    Jan. 17, 2008

Related U.S. Application Data (63) Continuation of application No. 11/194,934, filed on Aug. 2, 2005, now Pat. No. 7,251,191.

(30) Foreign Application Priority Data

Dec. 3, 2004    (KR) .................. 10-2004-0101265

(51) Int. Cl.
*G11C 8/00* (2006.01)
(52) U.S. Cl. ..................................... 365/233; 365/194
(58) Field of Classification Search ................ 365/233, 365/193, 194, 189.01
See application file for complete search history.

(56) References Cited

U.S. PATENT DOCUMENTS

| | | | | |
|---|---|---|---|---|
| 6,166,990 | A | * 12/2000 | Ooishi et al. | 365/233.11 |
| 6,212,127 | B1 | * 4/2001 | Funaba et al. | 365/233.12 |
| 6,269,051 | B1 | * 7/2001 | Funaba et al. | 365/233.11 |
| 6,449,674 | B1 | 9/2002 | Yun et al. | |
| 6,680,866 | B2 | 1/2004 | Kajimoto | |
| 6,778,465 | B2 | 8/2004 | Shin | |
| 2004/0109382 | A1 | 6/2004 | Chung et al. | |

FOREIGN PATENT DOCUMENTS

TW    464876    11/2001

* cited by examiner

*Primary Examiner*—Gene N. Auduong
(74) *Attorney, Agent, or Firm*—Ladas & Parry LLP

(57) ABSTRACT

Disclosed is a method for controlling a time point for data output in a synchronous memory device, which varies a time point of an internal read command of the synchronous memory device, which is generated in response to an external read command according to the CAS latency of the synchronous memory device. In other words, the time point to generate the internal read command when CAS latency corresponds to 2N+2 (N=0, 1, 2, . . . ) is delayed by 1tCK as compared with the time point to generate the internal read command when CAS latency corresponds to 2N+1, and the 1tCK is a period of an external clock applied to the synchronous memory device.

7 Claims, 5 Drawing Sheets

METHOD FOR CONTROLLING TIME POINT FOR DATA OUTPUT IN SYNCHRONOUS MEMORY DEVICE

This is a continuation of U.S. patent application Ser. No. 11/194,934, filed Aug. 2, 2005, now U.S. Pat. No. 7,251,191.

BACKGROUND OF THE INVENTION

1. Field of the Invention

The present invention relates to a method for controlling a time point for data output in a synchronous memory device, and more particular to a method for controlling a time point for data output in a synchronous memory device according to CAS latency.

2. Description of the Prior Art

As generally known in the art, a memory device such as a DDR SDRAM generates a plurality of control signals (e.g., OE00, OE10, OE30, and OE50 shown in FIG. 1E) used for controlling the operation of a data output driver according to CAS latency. Conventionally, these control signals are sequentially generated. In other words, the control signals are generated in the order of OE00, OE10, OE20, OE30, OE40 and OE50. For reference, the OE20 is generated with delay of 1tCK (1tCK is a period of an internal clock signal) as compared with the OE10, the OE30 is generated with delay of 1tCK as compared with the OE20, and the OE40 is generated with delay of 1tCK as compared with the OE30. As can be understood from the above, the OE00 and the OE10 are generated with a time difference of 1tCK, and the OE10 and the OE20 are generated with a time difference of 1tCK. In other words, a time difference between OE signals adjacent to each other is 1tCK. However, as the internal operation frequency of a memory device increases, the time difference may decrease below 1tCK. As the time difference decreases, the control signals (OE signal) sequentially generated with the time difference of 1tCK may collide with each other. This collision may cause malfunction when the memory device outputs data.

SUMMARY OF THE INVENTION

Accordingly, the present invention has been made to solve the above-mentioned problems occurring in the prior art, and an object of the present invention is to provide a method for controlling time point for data output by generating control signals (OE signals) with a time difference of 2tCK when the operation frequency increases.

It is another object of the present invention to provide a method capable of outputting data by selecting one of control signals generated with a time interval of 2tCK when CAS latency is an odd number and delaying a time point of a read command by a time interval of 1tCK when CAS latency is an even number such that an operation of a memory device with the CAS latency of even number is identical to an operation of the memory device with the CAS latency of odd number.

It is still another object of the present invention to provide a method of using a signal obtained by dividing a DDR clock signal in the two-division ratio in order to generate a control signal with a time interval of 2tCK.

To accomplish the above objects, there is provided a method for controlling a time point for data output of a synchronous memory device, the method comprising the step of varying a time point of an internal read command of the synchronous memory device, which is generated in response to an external read command according to the CAS latency of the synchronous memory device, depending on the CAS latency having an odd number or an even number.

According to an embodiment of the present invention, the time point to generate the internal read command when CAS latency corresponds to 2N+2(N=0, 1, 2, . . . ) is delayed by 1tCK as compared with the time point to generate the internal read command when CAS latency corresponds to 2N+1, and the 1tCK is a period of an external clock applied to the synchronous memory device.

In addition, according to an embodiment of the present invention, a plurality of control signals are outputted in response to the internal read command, the control signals being used for controlling a time point to enable a data output driver of the synchronous memory device.

According to another aspect of the present invention, there is provided a method for controlling a time point for data output in a synchronous memory device, wherein a first control signal is identical to a second control signal, the first control signal controlling the data output time when CAS latency of the synchronous memory device corresponds to 2N+2(N=0, 1, 2, . . . ), the second control signal controlling the data output time when the CAS latency corresponds to 2N+1.

According to another embodiment of the present invention, a time point to generate a first internal read command by receiving an external read command when the CAS latency corresponds to 2N+2 is delayed by 1tCK as compared with a time point to generate a second internal read command by receiving the external read command when the CAS latency corresponds to 2N+1, the first internal read command being used in the memory device, and the 1tCK is a period of an external clock applied to the synchronous memory device.

According to another embodiment of the present invention, a time until the first control signal is generated from after the first internal read command is generated is identical to a time until the second control signal is generated from after the second internal read command is generated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 1A:
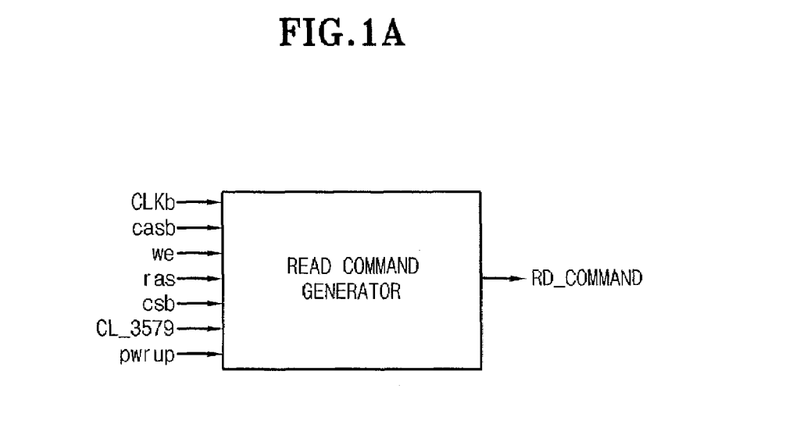
FIGS. 1A to 1E are schematic views of the present invention.

FIG. 1A is a block diagram illustrating a read command generator according to the present invention.

As shown in FIG. 1A, 'CLKb' denotes an inverted external clock signal, 'casb' denotes a column address strobe bar signal, 'we' denotes a write enable signal, 'ras' denotes a low address strobe signal, 'csb' denotes a chip select bar signal, 'pwrup' denotes a power up signal, and 'RD_COMMNAD' denotes an internal read command generated by the external read command. Particularly, 'CL_3579' denotes CAS latency and represents that one of CL=3, 5, 7, and 9 is applied. Herein, CAS latency is the number of clocks corresponding to a time interval required for outputting data after an external read command is applied.

Figure 6:
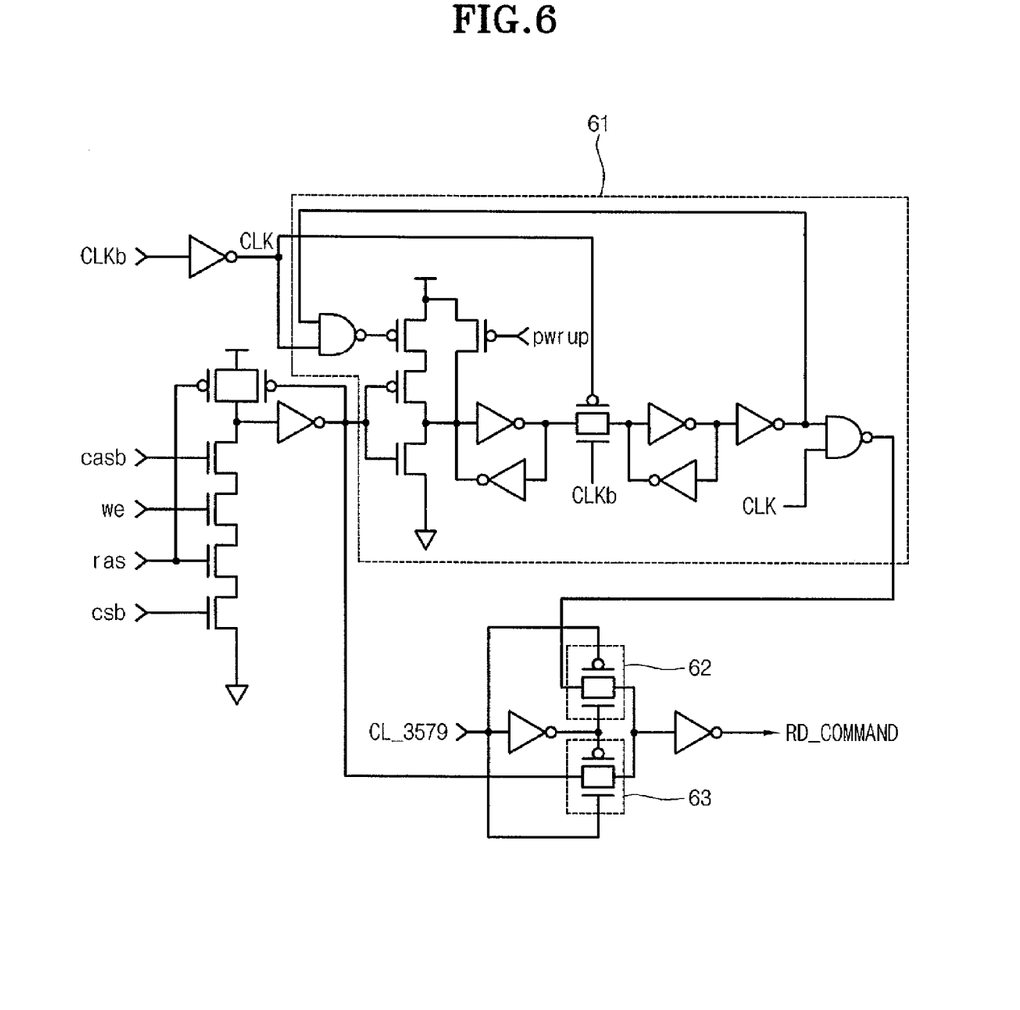
FIG. 6 illustrates an example of a read command generator described with reference to FIG. 1A.

The read command generator shown in FIG. 1A receives the external signal and generates a read command used in a memory device. In addition, a detailed circuit of FIG. 1A is shown in FIG. 6. The description about the detailed circuit of FIG. 1A will be described later.

Figure 1B:
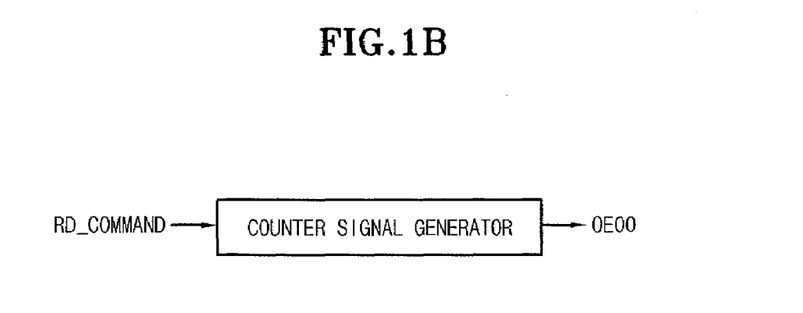

FIG. 1B is a block diagram illustrating a counter signal generator for generating an internal counter signal OE00 which is a control signal used for controlling a time point for read data output by receiving the read command RD_COMMAND. In other words, the internal counter signal OE00 stands for an output enable signal used for transmitting read data to the outside of the memory device. The waveform of the internal counter signal OE00 is shown in FIG. 2. Another plurality of internal counter signals OE10, OE30, OE50, etc., to be described later are generated by using the internal counter signal OE00 (see FIG. 1E). These internal counter signals OE10, OE30, OE50, etc., control a time point to operate an output driver, thereby controlling a time point for data output stored in the output driver. Herein, the internal counter signals OE10, OE30, OE50, OE70, etc., are generated in synchronization with a rising edge of a DLL clock, and the internal counter output signals OE35, OE55, OE75, and OE95 to be described are generated in synchronization with a falling edge of the DLL clock. According to the present invention, after the internal counter signal OE00 is applied, a time difference between neighboring signals among the sequentially-generated internal counter signals OE10, OE30, OE50, etc., shown in FIG. 1B corresponds to 2tCK. In other words, a time difference between the internal counter signal OE10 and the internal counter signal OE30 corresponds to 2tCK, and a time difference between the internal counter signal OE30 and the internal counter signal OE50 corresponds to 2tCK also.

Figure 1C:
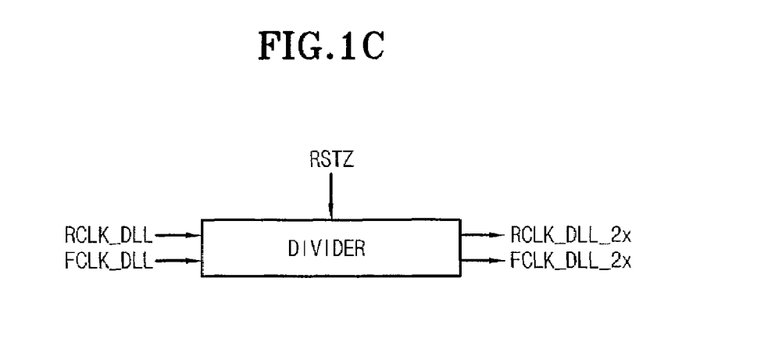

FIG. 1C is a block diagram illustrating a divider.

Figure 4:
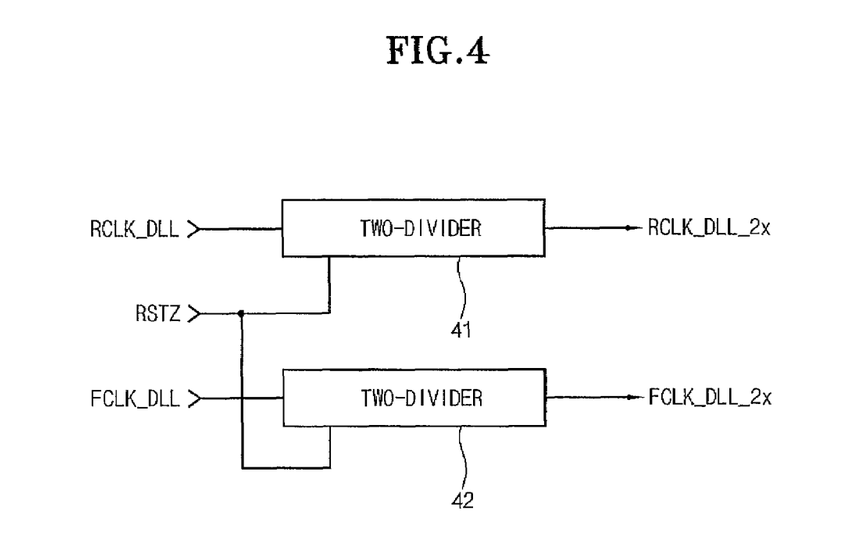
FIG. 4 illustrates an example of a divider shown in FIG. 1C.

The divider shown in FIG. 1C receives a rising DLL clock RCLK_DLL and a falling DLL clock FCLK_DLL output from a DLL circuit of the memory device. The divider divides the frequency of an input signal in the two-division ratio. Accordingly, output signals RCLK_DLL_2K and FCLK_DLL_2X of the divider have double periods as compared with the periods of the input signals RCLK_DLL and FCLK_DLL. For reference, a detailed circuit in FIG. 1C is shown in FIG. 4.

Figure 1D:
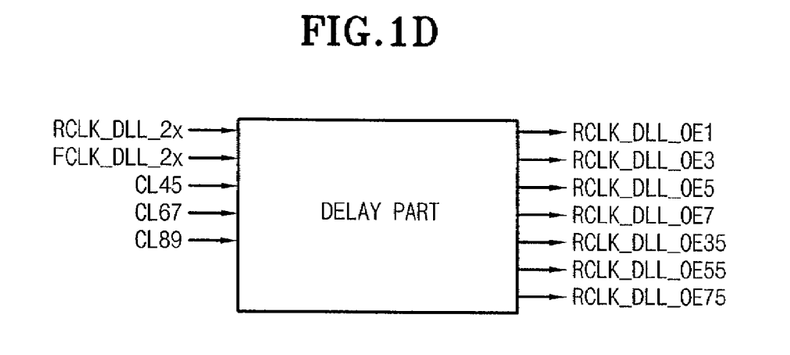

FIG. 1D is a block diagram illustrating a delay circuit delaying the output signals of the divider by a predetermined time interval according to CAS latency.

In FIG. 1D, 'CL45' stands for a case where CAS latency CL=4 or 5, 'CL67' stands for a case where CAS latency CL=6 or 7, and 'CL89' stands for a case where CAS latency CL=8 or 9. Output signals RCLK_DLL_OE1, RCLK_DLL_OE3, RCLK_DLL_OE5, RCLK_DLL_OE7, RCLK_DLL_OE35, RCLK_DLL_OE55, and RCLK_DLL_OE75 of the delay circuit are generated by delaying the input signals RCLK_DLL_2X and FCLK_DLL_2X by a predetermined time interval. These signals will be described in more detail with reference to FIG. 2.

Figure 1E:
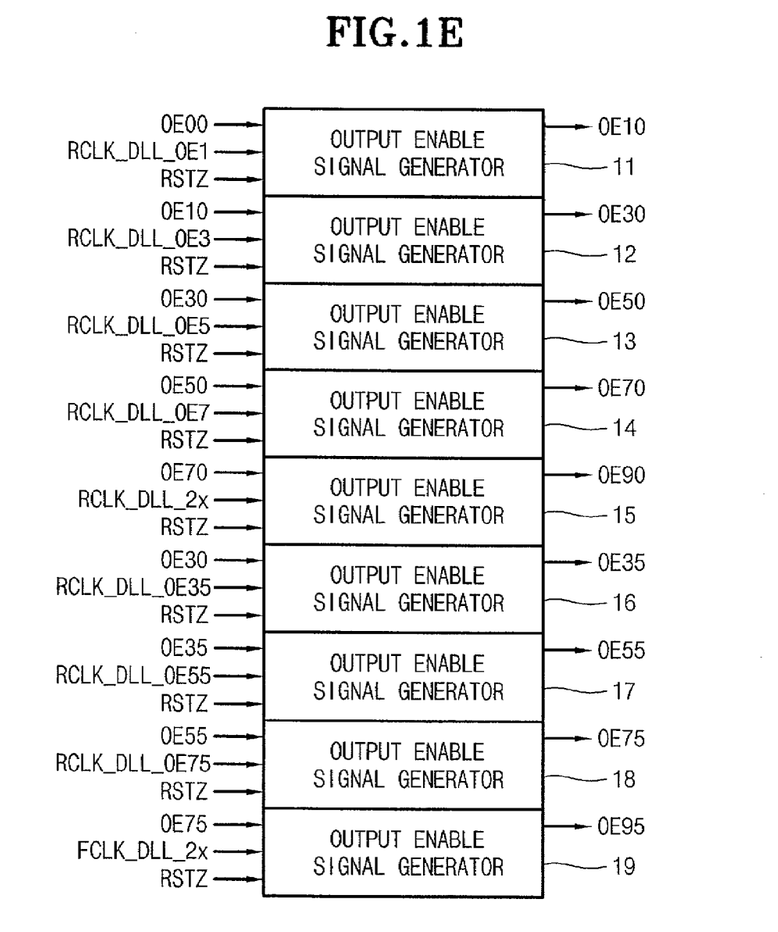
Figure 2:
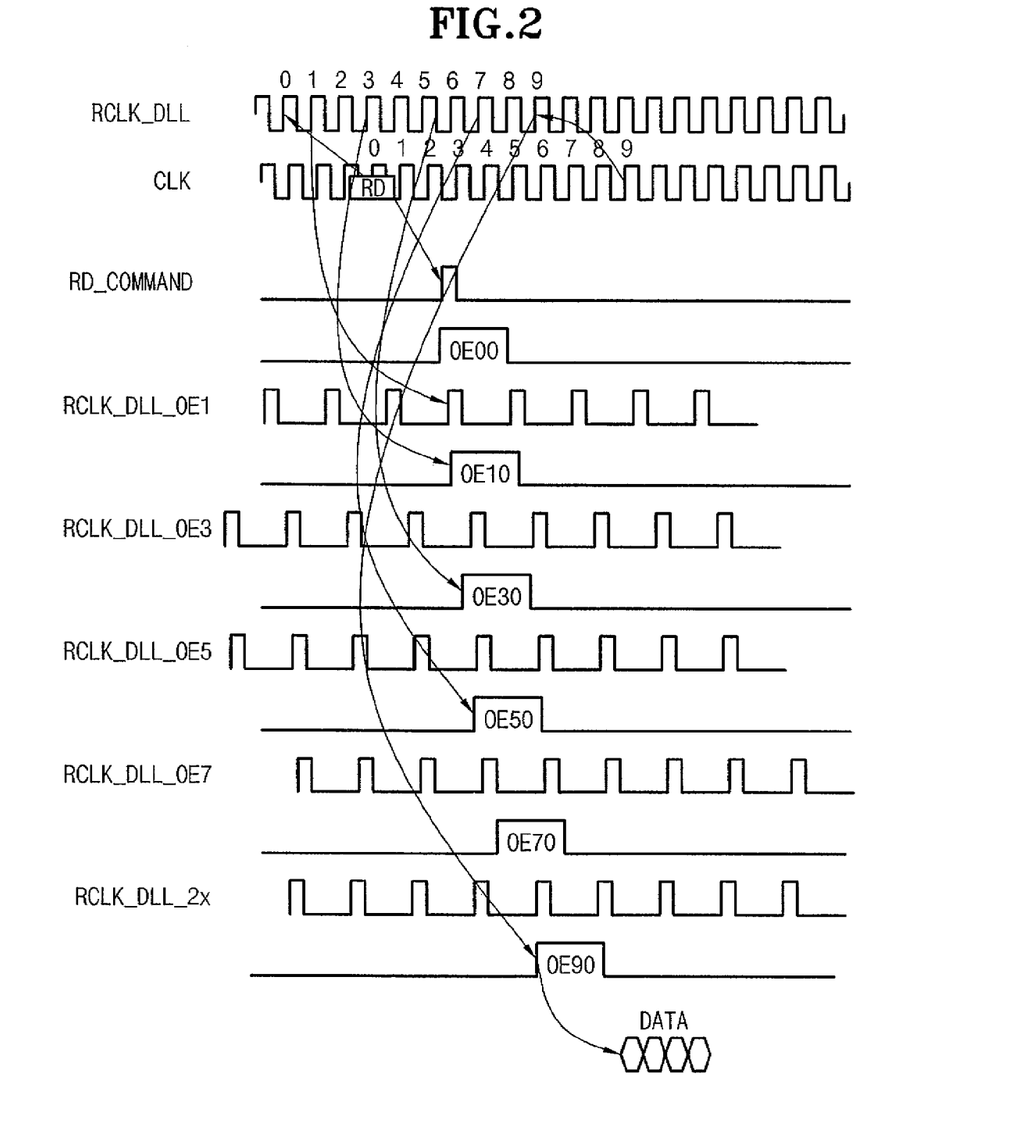
FIG. 2 illustrates a time chart for explaining operations of circuits shown in FIGS. 1A to 1E.

FIG. 1E is a block diagram illustrating a counter including a plurality of output enable signal generating parts.

An output enable signal generating part 11 receives the internal counter signal OE00 (an output signal shown in FIG. 1B), the delay signal RCLK_DLL_OE1 output from the delay circuit shown in FIG. 1D, and a reset signal RSTZ, thereby outputting a count signal OE10.

An output enable signal generating part 12 receives the count signal OE10 (the output signal of the output enable signal generating part 11), the delay signal RCLK_DLL_OE3 output from the delay circuit shown in FIG. 1D, and a reset signal RSTZ, thereby outputting a count signal OE30.

An output enable signal generating part 13 receives the count signal OE30 (the output signal of the output enable signal generating part 12), the delay signal RCLK_DLL_OE5 output from the delay circuit shown in FIG. 1D, and a reset signal RSTZ, thereby outputting a count signal OE30.

An output enable signal generating part 14 receives the count signal OE50 (the output signal of the output enable signal generating part 13), the delay signal RCLK_DLL_OE5 output from the delay circuit shown in FIG. 1D, and a reset signal RSTZ, thereby outputting a count signal OE70.

An output enable signal generating part 15 receives the count signal OE70, which is the output signal of the output enable signal generating part 14, the delay signal RCLK_DLL_2X output from the divider shown in FIG. 1C, and a reset signal RSTZ, thereby outputting a count signal OE90.

An output enable signal generating part 16 receives the count signal OE30, which is the output signal of the output enable signal generating part 12, the delay signal RCLK_DLL_OE35 output from the delay circuit shown in FIG. 1D, and a reset signal RSTZ, thereby outputting a count signal OE35.

An output enable signal generating part 17 receives the count signal OE35, which is the output signal of the output enable signal generating part 16, the delay signal RCLK_DLL_OE55 output from the delay circuit shown in FIG. 1D, and a reset signal RSTZ, thereby outputting a count signal OE55.

An output enable signal generating part 18 receives the count signal OE55, which is the output signal of the output enable signal generating part 17, the delay signal RCLK_DLL_OE75 output from the delay circuit shown in FIG. 1D, and a reset signal RSTZ, thereby outputting a count signal OE75.

An output enable signal generating part 19 receives the count signal OE75, which is the output signal of the output enable signal generating part 17, the delay signal RCLK_DLL_2X output from the divider shown in FIG. 1C, and a reset signal RSTZ, thereby outputting a count signal OE95.

As described above, the output signals OE10, OE30, . . . , OE95 shown in FIG. 1E controls a time point for data output stored in the output driver of the memory device. According to CAS latency, one of these output signals is selected so as to determine a time point to enable the output driver. Herein, the output signal OE30 is outputted with negative delay of 2tCK-α as compared with the output signal OE10, and the output signal OE50 is outputted with negative delay of 2tCK-α as compared with the output signal OE30. The remaining output signals are outputted in the same manner. For reference, the output signals OE10, OE30, OE50, OE70, and OE90 are generated based on the rising edge of the DLL clock, and the output signals OE35, OE55, OE75, and OE95 are generated based on the falling edge of the DLL clock. The output signals OE35 and OE55 are generated with an interval of 2tCK. The remaining output signals are also generated with an interval of 2tCK.

FIG. 2 illustrates a time chart for explaining operations of circuits shown in FIGS. 1A to 1E.

As shown in FIG. 2, 'RCLK_DLL' stands for a rising DLL clock outputted from the DLL circuit, 'CLK' stands for an external clock, and 'RD_COMMAND' stands for an internal read command signal generated from the read command generator. Signals RCLK_DLL_OE1, RCLK_DLL_OE3, RLCK_DLL_OE5, and RLCK_DLL_OE7 represent signals output from the delay circuit shown in FIG. 1D. The signal RCLK_DLL_2X is obtained by dividing the signal RCLK_DLL in the two-division ratio.

FIG. 2 illustrates a time chart when CAS latency corresponds to 9.

Since CL=9, after a read command is applied and then nine clock pulses lapse, data must be output to the outside of the memory device. For the purpose of description, the rising edge when the read command is applied is represented as '0'. The rising edges of the external clock, which are sequentially generated, are represented as '1, 2, 3, . . . ', respectively. Accordingly, when CL=9, data are output after the nin$^{th}$ pulse of the external clock CLK. According to the present invention, in order to output data correspondingly to CAS latency, a synchronous memory device employs the DLL clock RCLK_DLL generated from the DLL circuit. For reference, the DLL clock RCLK_DLL according to the present invention rises in synchronization with the rising edge of the external clock applied to the memory device, and the DLL clock FCLK_DLL rises in synchronization with the falling edge of the external clock applied to the memory device.

As shown in FIG. 2, the DLL clock RCLK_DLL is negatively delayed with respect to the external clock CLK. As generally known, this is because it is necessary to compensate for delay when data are output after the read command is applied from an external device. As shown in FIG. 2, the numerals marked on the DLL clock RCLK_DLL correspond to the rising edges of the external clock signal CLK.

As can be understood from FIG. 2, the internal counter signal OE00 is generated in response to the read command RD_COMMAND (see FIGS. 1b and 6). The counter signal OE10 is generated by the counter signal OE00 and the signal RCLK_DLL_OE1. The counter signal OE30 is generated by the counter signal OE10 and the signal RCLK_DLL_OE3. The counter signal OE50 is generated by the counter signal OE30 and the signal RCLK_DLL_OE5. The counter signal OE70 is generated by the counter signal OE50 and the signal RCLK_DLL_OE7. The counter signal OE90 is generated by the counter signal OE70 and the signal RCLK_DLL_2X. In addition, the counter signal OE90 is output correspondingly to the nin$^{th}$ rising edge of the DLL clock RCLK_DLL.

In the operations of the circuits, if the counter signal OE90 is enabled and if CAS latency corresponds to, for example, 9, the data output driver (not shown) is enabled. As shown in FIG. 2, the data output driver outputs data in synchronization with the nin$^{th}$ pulse of the external clock CLK from after the read command is applied. In other words, since the output driver is enabled while the counter signal OE90 is being enabled at a high level, data may be output to an external device after a predetermined time interval. Herein, the data are output to an external device from the nin$^{th}$ pulse of the external clock signal CLK after the read command is applied.

Hereinafter, the structures of circuits shown in FIGS. 3 to 7 will be described.

Figure 3:
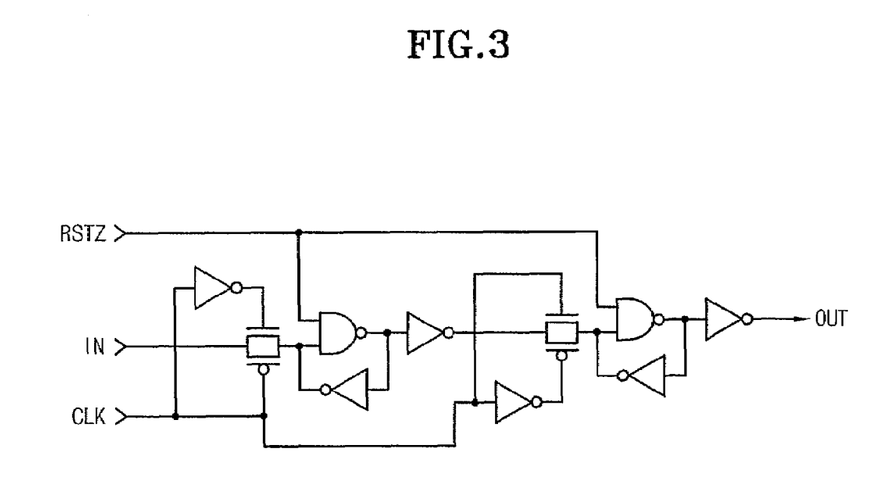
FIG. 3 illustrates an example of an output enable signal generating part employed in a counter circuit shown in FIG. 1E.

FIG. 3 illustrates an example of an output enable signal generating part employed in the counter circuit shown in FIG. 1E.

As shown in FIG. 3, 'RSTZ' represents a reset signal, 'IN' represents one of the output signals OE00, OE10, OE30, OE50, OE70, OE35, OE55, and OE75 applied to output enable signal generating parts, 'CLK' represents one of the signals RCLK_DLL_OE1, RCLK_DLL_OE3, RCLK_DLL_OE5, RCLK_DLL_OE7, RCLK_DLL_OE35, RCLK_DLL_OE55, RCLK_DLL_OE75, RCLK_DLL_2X, and FCLK_DLL_2X applied to the output enable signal generating parts, respectively, and 'OUT' represents the output of each output enable signal generating part. Herein, the signals RCLK_DLL_2X and FLCK_DLL_2X have double periods as compared with that of the DLL clocks RCLK_DLL and FCLK_DLL. These signals will be described later with reference to FIG. 4.

In the operation of the output enable signal generating part, the IN signal is received and latched when the CLK is at a low level, and the latched IN signal is outputted when the CLK is at a high level. For reference, the RSTZ maintains a high level in a normal operation.

FIG. 4 illustrates an example of the divider shown in FIG. 1C.

As shown in FIG. 4, the rising DLL clock RCLK_DLL is applied to a two-divider 41 and is outputted as a signal RCLK_DLL_2X having a double period as compared with that of the RCLK_DLL. In addition, the falling DLL clock FCLK_DLL is applied to a two-divider 42 and is outputted as a signal FCLK_DLL_2X having a double period as compared with that of the FCLK_DLL.

Figure 5:
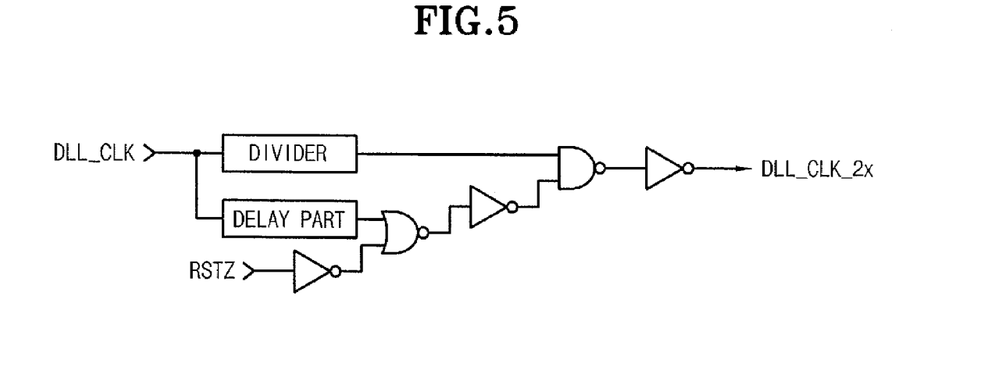
FIG. 5 illustrates a detailed example of a two-divider shown in FIG. 4.

FIG. 5 illustrates a detailed example of the two-divider 41 or 42 shown in FIG. 4.

FIG. 5 illustrates an example of the two-divider shown in FIG. 4. As shown in FIG. 5, a divider 51 doubles the period of an input signal, and a delay unit 52 delays the input signal by a predetermined time interval. Herein, the output signal DLL CLK_2X shown in FIG. 4 indicates the output signal RCLK_DLL_2X or FCLK_DLL_2X shown in FIG. 4. In addition, the input signal DLL_CLK shown in FIG. 5 indicates the input signal RCLK_DLL or FCLK_DLL shown in FIG. 4. Those skilled in the art variously realize a circuit of doubling the period of the input signal in addition to the example shown in FIG. 5 and employ the realized circuit for the circuit shown in FIG. 4.

FIG. 6 illustrates an example of the read command generator described with reference to FIG. 1A.

As shown in FIG. 6, the read command generator generates a read command signal by combining received external signals casb, we, ras, and csb.

In the operation of the read command generator, a switch element 63 is turned on when CAS latency corresponds to an odd number (i.e., CL=3, CL=5, CL=7 or CL=9). Accordingly, the read command determined by the external signal is applied to the inside of the memory device by the switch element 63. The internal read command applied to the memory device is 'RD_COMMAND'.

In contrast, a switch element 62 is turned on when CAS latency corresponds to an even number (i.e., CL=5, CL=6, or CL=8). The read command determined by the external signal is delayed in the delay circuit 61 by a predetermined time interval and then is applied to the inside of the memory device by the switch element 62. The delay circuit 61 is controlled by the external clock signals CLK and CLKb, and the delay time point of the delay circuit 61 corresponds to 1tCK. Herein, the tCK represents the period of the external clock signal CLK.

As can be understood from FIG. 6, the read command generator disclosed in FIG. 6 directly delivers the read command applied from an external device to the inside of the memory device when CAS latency corresponds to an odd number. In addition, when CAS latency corresponds to an even number, the read command generator delays the read command by a time interval of 1tCK and then delivers the read command to the inside of the memory device.

For example, a read command delayed by a time interval of 1tCK is applied when CL=4. Accordingly, the internal operation when CL=4 is identical to the internal operation when CL=3. In detail, when CL of the memory device corresponds to 4, the internal read command RD_COMMAND to be applied is delayed by a time interval of 1tCK as shown in FIG. 6. Accordingly, the operation when CL=4 is identical to that when CL=3 in the memory device. Accordingly, data can be outputted in synchronization with the internal counter signal OE30 even when CL=4. Thus, according to the present invention, the internal read command RD_COMMAND is delayed by a predetermined time interval of 1tCK and then outputted when CL corresponds to an even number, so that operation timing when CL corresponds to an even number can be identical to that when CL corresponds to an odd number. As a result, differently from the conventional technique, operations when CL=2, 4, 6, etc., can be performed using only the internal counter signals OE10, OE30, OE50, etc., generated with a period of 2Tck. In other words, according to the present invention, although only the counter signals OE10, OE30, OE50, etc., generated with a time interval of 2Tck are used, a time point for data output can be controlled with respect to all cases where CAS latency corresponds to 2, 3, 4, 5, 6, 7, etc.

As can be understood from above description, as the operation frequency of the memory device increases, the conventional technique having generated internal counter signals with a time interval of 1tCK has a high probability of causing a superposition phenomenon between the internal counter signals. The superposition between the internal counter signals causes an erroneous time point to output data. However, according to the present invention, internal counter signals are generated with a time interval of 2tCK, thereby enabling a stable data output operation even when the operation frequency of the memory device increases. In addition, the effect of the present invention may be significantly represented, as the operation frequency of the memory device increases.

As can be understood from above description, the present invention proposes a method for controlling a data output driver using control signals generated with a time interval of 2 clock, thereby enabling data output correspondingly to CAS latency even when the operation frequency of the memory device increases.

Although a preferred embodiment of the present invention has been described for illustrative purposes, those skilled in the art will appreciate that various modifications, additions and substitutions are possible, without departing from the scope and spirit of the invention as disclosed in the accompanying claims.

I claim:

1. An apparatus for controlling timing for data output of a synchronous memory device based on rising and falling clock inputs and based on CAS latency of accessing the synchronous memory device, the apparatus comprising:
   a read command generator configured to receive an external read command and configured to generate an internal read command,
      wherein the external read command includes a plurality of external signals including a CAS latency signal, wherein the CAS latency signal corresponds to the number of clock cycles between receiving the external read command and reading data from a memory cell in the synchronous memory device;
   a frequency divider configured to receive the rising and falling clock inputs and configured to output rising and falling clock outputs in which the rising and falling clock output periods are approximately twice that of the rising and falling clock input periods;
   a delay circuit configured to receive the CAS latency signal and to receive the rising and falling clock outputs, and configured to generate a plurality of delayed clock signals based on a predetermined time interval according to the received CAS latency signal;
   a counter signal generator configured to receive the internal read command and configured to generate an internal counter signal in response to the received internal read command;
   a counter comprising a plurality of output enable signal generator parts, the counter configured to receive the internal counter signal, the plurality of delayed clock signals, the rising and falling clock outputs, and a reset signal, and the counter configured to output a plurality of internal counter signals,
   wherein each output enable signal generator part of the counter configured to receive the reset signal and configured to generate one of the internal counter signals,
   wherein the internal counter signals control timing points that enable a data output driver of the synchronous memory device, thereby the internal read command controls data output timing of the synchronous memory device.

2. The apparatus of claim 1, wherein counter is configured to delay output timing, relative to the external read command, of the internal counter signals dependent on the CAS latency signal having an odd number or an even number.

3. The apparatus of claim 1 wherein the counter is configured to delay output timing, relative to the external read command, of the internal counter signals dependent on the CAS latency signal having an odd number defined by 2N+1 (where N=0, 1, 2, . . . ) at a first time point corresponding to each odd number.

4. The apparatus of claim 1 wherein the counter is configured to delay output timing, relative to the external read command, of the internal counter signals dependent on the CAS latency signal having an even number defined by 2N+2 at a second time point corresponding to each even number.

5. The apparatus of claim 3 wherein the counter is configured to delay output timing, relative to the external read command, of the internal counter signals dependent on the CAS latency signal having an even number defined by 2N+2 at a second time point corresponding to each even number.

6. The apparatus of claim 5 wherein the counter is configured to output internal counter signals at substantially identical time points when the CAS latency signal associated with the odd number and the CAS latency signal associated with the even number share a common N value.

7. The apparatus of claim 5 wherein the counter is configured to delay output timing, relative to the external read command, of the internal counter signals at the second time point by 1tCK when the CAS latency signal has the even number as compared to the delay output timing of the internal counter signals at the first time point when the CAS latency signal corresponds to 2N+1, in which 1tCK is defined as a period of an external clock applied to the synchronous memory device.

* * * * *